Figure 1:
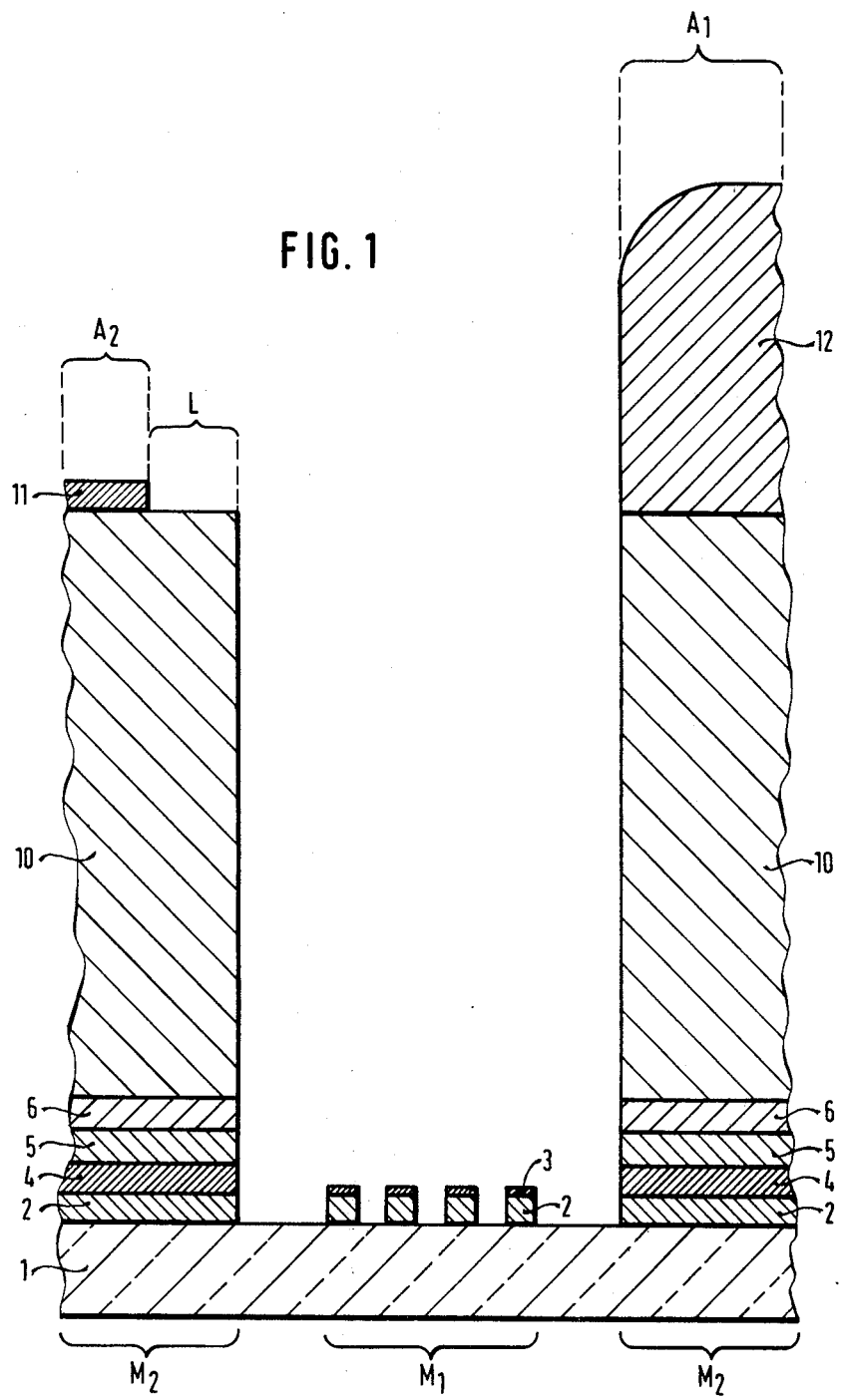

United States Patent [19]

Küttner

[11] 4,424,409

[45] Jan. 3, 1984

[54] THIN-FILM ELECTRONIC CIRCUIT UNIT

[75] Inventor: Klaus Küttner, Stuttgart, Fed. Rep. of Germany

[73] Assignee: Robert Bosch GmbH, Stuttgart, Fed. Rep. of Germany

[21] Appl. No.: 335,165

[22] Filed: Dec. 28, 1981

[30] Foreign Application Priority Data

Jan. 15, 1981 [DE] Fed. Rep. of Germany ....... 3101032
Sep. 12, 1981 [DE] Fed. Rep. of Germany ....... 3136198

[51] Int. Cl.³ .............................................. H05K 1/09
[52] U.S. Cl. .................................. 174/68.5; 361/403; 361/411
[58] Field of Search ............... 174/68.5; 361/403, 411, 361/400

[56] References Cited

U.S. PATENT DOCUMENTS

| | | | |
|---|---|---|---|
| 2,294,482 | 9/1942 | Seigmund | 361/411 |
| 3,436,605 | 4/1969 | Landron | 361/403 |
| 3,786,172 | 1/1974 | Conley | 174/68.5 |
| 4,075,416 | 2/1978 | Kuttner et al. | 174/68.5 |
| 4,104,111 | 8/1978 | Mack | 174/68.5 X |
| 4,109,297 | 8/1978 | Lesh et al. | 361/402 |

Primary Examiner—R. R. Kucia
Attorney, Agent, or Firm—Frishauf, Holtz, Goodman & Woodward

[57] ABSTRACT

A tantalum layer (2) is formed on an insulating substrate and etched to produce two connecting patterns, a first defining a resistance network and the second defining connection paths and contact areas. The second pattern is provided with metallization, either in a single nickel layer or in a nickel layer provided between thin copper layers, the metallization being of the order of a few tenths of a micron. Instead of providing a soft solder layer directly on the metallization, however, a copper layer at least to 2 microns thick is first put on to provide reinforcement and high conductivity. When the contact areas are provided with a soft solder top coating, it is possible to connect additional components to the unit by dipping into flowing solder without impairing the conductivity of the connection paths. Wire bonding to the contact areas can be accomplished if the contact areas are provided with an outer layer of gold.

3 Claims, 2 Drawing Figures ically applied (electroplated) copper layer which in the present illustrative example has a thickness of 4 μm. It serves as a reinforc
THIN-FILM ELECTRONIC CIRCUIT UNIT This invention concerns a thin-film electronic circuit unit mounted on an insulating substrate on which a layer of a valve metal such as tantalum partly covering the substrate is applied in two patterns which interconnect, one of these defining components of the circuit and the other defining contact paths and contact areas.

As shown in U.S. Pat. No. 3,872,356, such thin-film electronic circuit units are provided with metallization on top of the circuit path and contact area portion of the valve metal layer pattern, on top of which a lead-tin soft solder layer is applied in order to raise the conductivity of the connection paths and contact areas. This solder layer also facilitates external connections of the circuit unit with its electronic circuit environment and for adding additional electrical components to the unit.

The soft solder layer just described, however, has the disadvantage that its application is fluctuating and uneven and in many places is relatively thin. When additional electrical components are mounted and connected in the "reflow" soldering process there is an additional effect on the thickness of the soft solder layer, because this operation draws away a portion of the solder from the contact areas and connection paths, which leads to impaired conductivity of the contact paths and contact areas and often to failure of the thin film electronic circuit unit.

THE INVENTION

It is an object of the present invention to provide a better structure of the circuit paths and contact areas in a thin film electronic circuit so that conductivity will not be subject to impairment when additional components are connected to the circuit unit by dipping the circuit path side of it in flowing melted solder.

Briefly, a conducting layer of copper, which does not melt at the temperature of molten solder at least 2 μm thick is provided on top of the metallization consisting of a single layer of nickel for facilitating contact with the valve metal layer in the portions of the latter defining the circuit paths and contact areas, the copper layer thus being thick enough to reinforce the metallization and thereby preserve the integrity of the conducting paths and contact areas, as well as to increase conductivity. This has the advantage that the connection paths and the contact areas have a sufficient conductivity throughout and that this conductivity is independent of the particular connection technique that is used, whether reflow soldering or chip-and-wire bonding. Both of these technologies are compatible with the thin-film circuit units of the present invention.

The metallization thickness is usually and preferably of the order of a few tenths of a micron. Whereas the metallization layers are usually and preferably provided by sputtering, like the valve metal layer, it is preferred to apply the copper layer by electroplating.

The copper layer is left uncovered in the portion thereof that defines electrical connection paths as distinguished from contact areas. In the portion of the copper layer corresponding to contact areas, the covering that is desirable depends upon the type of connection technique to be used, a gold layer being suitable for the wire bonding technique and a soft solder layer for the reflow soldering process.

THE DRAWING

Figure 2:
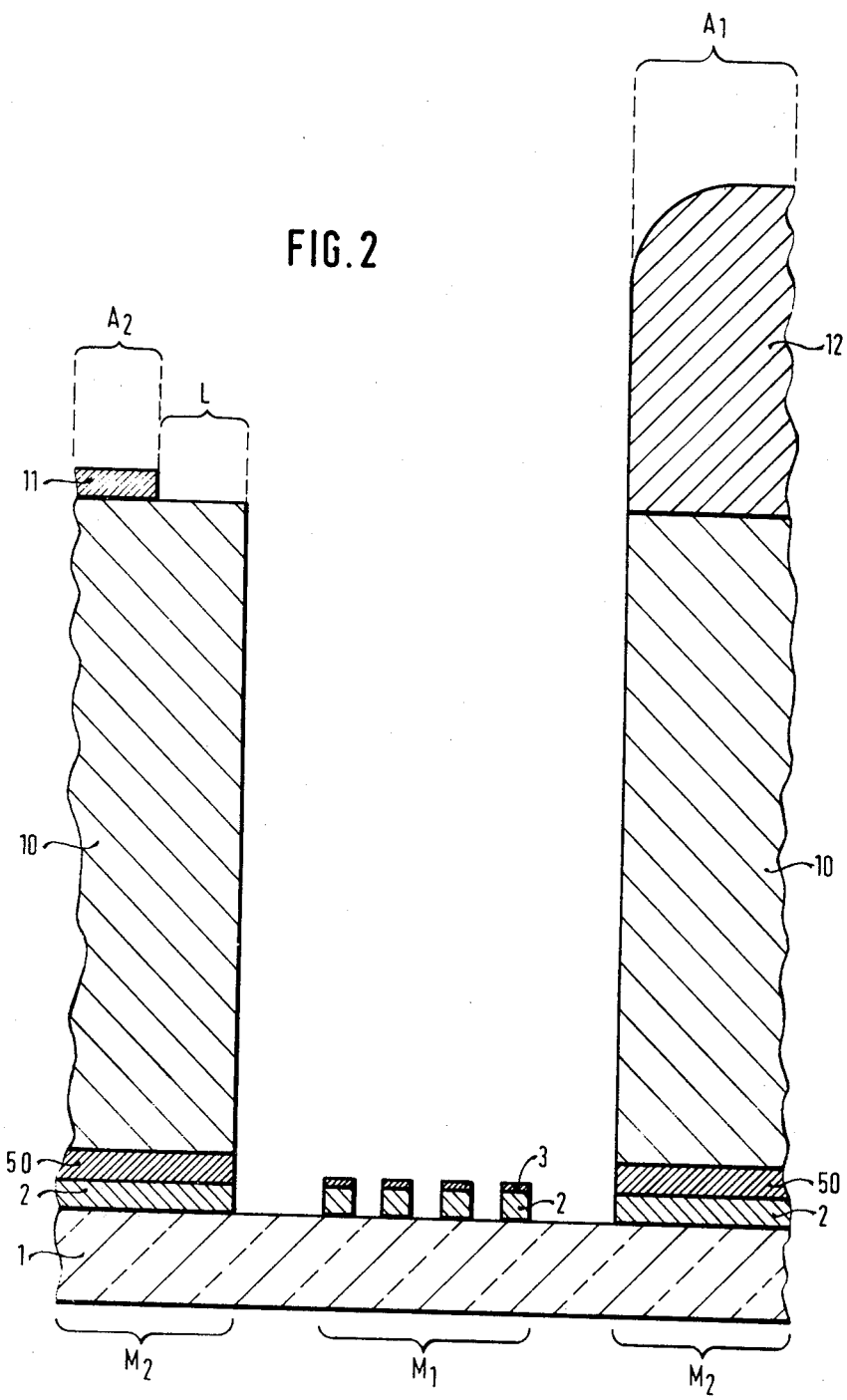

The invention is further described by way of example with reference to the annexed drawings, in which:

FIG. 1 shows a partial cross section of a thin film electronic circuit unit according to the invention containing a resistance network, with the reinforcing conducting layer applied above a multi-layer metallization, and FIG. 2 is a similar partial cross section of a thin film electronic circuit unit, in this one provided with a single-layer metallization of the valve metal layer portion constituting the circuit paths and contact areas.

DESCRIPTION OF THE ILLUSTRATED EXAMPLES

As shown in FIG. 1, on an insulating substrate 1 in the form of a small carrier plate, a layer 2 of valve metal of a thickness of 1000 Å is supplied by cathodic sputtering in the geometric pattern of a circuit network. By valve metal is understood a metal that forms an oxide blocking direct current. This metal is preferably tantalum, but instead of it there can also be used the metals niobium, aluminum, zirconium and hafnium.

The valve metal layer 2 has no supplementary metallization on the portions thereof that constitute the resistance network, these portions being designated as occupying the surface regions $M_1$ in which the resistance network pattern, that may also be referred to as the $M_1$ pattern, is located. In the region of this pattern $M_1$ the valve metal layer 2 can, however, carry an oxide layer 3 which can be produced in such a way that the valve metal layer 2 is partially oxidized anodically at these locations.

In the surface regions $M_2$, which do not belong to the resistance network, however, the valve metal layer 2 is provided with metallization consisting of the layers 4, 5 and 6 serving as bonding media. The first layer 4 and the third layer 6 of this metallization are copper layers, in each case of a thickness of 2000 Å. The intermediate layer 5 running between these two copper layers 4 and 6 consists of a metal operating as a diffusion barrier, for example iron, nickel or cobalt. The thickness of this layer 5 is 4000 Å.

A superposed layer 10, which is substantially thicker in comparison with the layer system 4, 5 and 6, is shown in the drawing. This is a galvanically applied (electroplated) copper layer which in the present illustrative example has a thickness of 4 μm. It serves as a reinforcing layer for the layer system 2, 4, 5 and 6 in the region of the pattern $M_2$.

The layer system consisting of the metallization 4, 5, 6 and the reinforcing layer 10 is applied to all portions of the valve metal layer 2 that are designed to serve for the connection paths L and for contact areas $A_1, A_2$. In the conduction path portions, the reinforcing layer 10 is uncovered. In regions provided for contact areas $A_1$ designed for soft solder connections, an additional soft solder layer 12 is provided on top. In the region of contact areas $A_2$ designed for wire bonding contacts, a covering gold layer 11 is applied.

The $M_1$ pattern portions of the valve metal layer 2 which are not covered with the layers 4, 5, 6, 10, 11, 12 but have an oxide layer 3, form the resistance network of the thin-film circuit.

In the embodiment illustrated in FIG. 2, the three-layer metallization 4, 5 and 6 is replaced by a single layer 50 that consists of nickel. This layer has a thickness of 4000 Å.

In the manufacture of thin-film electronic circuit units according to the invention, a procedure is preferably used along the following lines.

The substrate plate 1 is first covered completely with the layer system 2,4,5,6,10 or in the case of FIG. 2, with the layer system 2,50,10. In one or more process steps, the basic geometry of the thin-film circuit is etched out. After the dissolving away of the first photomask, a second mask is applied which selectively bares the surface for the resistance meanders while covering the connection paths and the contact areas. By means of a selective etching medium, the conducting layers 4, 5, 6, 10 or 50, 10 are removed from the resistance meander surfaces. Then for production of the resistance meander from the resistance meander surfaces, a third photomask is applied. This contains the resistance geometry; it also covers the connection paths and the contact areas to protect them from the next etching step. Then the resistance geometry is etched out. If a trimming or balancing of resistance is required, this can be done by known processes, such as trimming by means of a laser, a sandblast, or by anodic oxidation. In the last mentioned case, anodic oxidation, the valve metal oxide layer 3 is then formed.

For resistance trimming by anodic oxidation, a covering mask is needed for the regions that are not to be modified, as well as for the connection paths and contact areas. By use of a positive film that can be exposed a number of times, it is possible, beginning from the ready condition, to remove the photofilm from the resistance paths by a subsequent photolithographic process.

A thin-film resistance network produced according to this process is a starting point for (a) thin-film hybrids made by reflow soldering technique: after the application of a solder blocking mask on the regions of the copper layer 10 which are not to be covered with solder, the network is dipped into a lead-tin soft solder bath. There is thereby provided on a lead-tin soft solder layer 12 on the regions $A_1$ to be coated with solder.

(b) thin-film hybrid units made by chip and wire bonding technique: in the chip and wire technique, it is advantageous to bond on a gold surface. For this purpose, an electroless gold layer 11 of about 1 μm is applied on all those regions $A_2$ on which bridging or chip bonds are to be established. A plating mask is used to cover those regions on which the gold is not to be applied.

The invention is not limited to the examples described with reference to the drawings.

For example, instead of the valve metal layer 2, a valve metal nitride layer can be used as a resistance layer, particularly a layer of tantalum nitride, or a valve metal oxinitride layer, particularly a layer of tantalum oxinitride. Such layer can be formed in the same manner to constitute circuit elements of an electronic thin-film circuit as in the case of layers of uncombined valve metal.

The thin-film resistance network according to the invention has a substantial advantage that the conductivity of the connection paths L is independent of the solder coating process, because the soft solder 12 is applied exclusively on the contact areas $A_1$ destined for soft solder contacts, and only for the purpose of connecting the components or external leads with the network of the thin-film circuit by means of the reflow soldering process, and not at the same time for providing sufficient conductivity to the connection paths L.

I claim:

1. A thin-film electronic circuit unit carried on a substrate (1) plate of insulation material comprising:

a first valve metal layer (2) of a thickness order of magnitude from one-tenth to several tenths of 1 μm located directly on said substrate and partly covering said substrate in first ($M_1$) and second ($M_2$) patterns which interconnect in at least one location and form first ($M_1$) and second ($M_2$) regions of said first valve metal layer (2), said first region thereof defining circuit component elements of said circuit unit and said second region thereof defining connection paths (L) and contact areas ($A_1,A_2$) of said circuit unit;

metallization of the thickness order of magnitude from one-tenth to several tenths of 1 μm and constituted by a single layer of nickel (50), superposed on said second region ($M_2$) of said valve metal layer;

a layer of copper (10) at least 2 μm thick of a metal that does not melt at temperatures to which it may be exposed in soldering operations performed in making connections to said circuit unit, superposed on said metallization (4,5,6;50), said copper layer serving to enhance conductivity of conducting paths and to reinforce said metallization to preserve the integrity of said conducting paths and contact areas and being uncovered in the portion of said second region ($M_2$) serving to provide electrical connection paths;

a layer of soft solder (12) covering said copper layer only in the portion of said second region ($M_2$) serving to provide particular electrical contact areas ($A_1$) for facilitating the soldering thereto of components by the reflow solder process, and a gold layer (11) in the portion of said second region ($M_2$) serving to provide particular electrical contact areas ($A_2$) for facilitating the electrical connection of components by chip-and-wire-bonding technique.

2. An electronic circuit unit as defined in claim 1, in which said copper layer (10) is an electroplated layer.

3. An electronic circuit unit as defined in claim 2, in which said valve metal layer (2) and said metallization (50) are cathodically-sputtered-on layers.

* * * * *